(12) United States Patent
Wampler et al.

(10) Patent No.: US 10,345,385 B2
(45) Date of Patent: Jul. 9, 2019

(54) BATTERY STATE ESTIMATION SYSTEMS AND METHODS USING A NONLINEAR RESISTANCE ELEMENT

(71) Applicant: GM GLOBAL TECHNOLOGY OPERATIONS LLC, Detroit, MI (US)

(72) Inventors: Charles W Wampler, Birmingham, MI (US); Mark W Verbrugge, Troy, MI (US); Brian J Koch, Berkley, MI (US); Patricia M Laskowsky, Ann Arbor, MI (US)

(73) Assignee: GM Global Technology Operations LLC., Detroit, MI (US)

( * ) Notice: Subject to any disclaimer, the term of this patent is extended or adjusted under 35 U.S.C. 154(b) by 140 days.

(21) Appl. No.: 14/887,926

(22) Filed: Oct. 20, 2015

(65) Prior Publication Data

US 2016/0039419 A1    Feb. 11, 2016

Related U.S. Application Data

(63) Continuation-in-part of application No. 14/275,553, filed on May 12, 2014, now Pat. No. 9,419,314.

(51) Int. Cl.

| | |
|---|---|
| *G01R 31/367* | (2019.01) |
| *G01R 31/36* | (2019.01) |
| *B60W 10/26* | (2006.01) |
| *B60W 10/192* | (2012.01) |
| *B60W 40/12* | (2012.01) |
| *G01R 31/392* | (2019.01) |
| *G01R 31/3842* | (2019.01) |
| *G01R 31/382* | (2019.01) |

(Continued)

(52) U.S. Cl.
CPC ......... *G01R 31/367* (2019.01); *B60W 10/192* (2013.01); *B60W 10/26* (2013.01); *B60W 40/12* (2013.01); *G01R 31/36* (2013.01); *G01R 31/382* (2019.01); *G01R 31/3842* (2019.01); *G01R 31/392* (2019.01); *H01M 10/4285* (2013.01); *H01M 10/48* (2013.01); *H01M 2220/20* (2013.01)

(58) Field of Classification Search
CPC .. H01M 10/4285; H01M 10/48; G01R 31/36; G01R 31/3651; G01R 31/3624; G01R 31/3679; G01R 31/3606; G01R 31/362
USPC .......................................... 320/132; 324/426
See application file for complete search history.

(56) References Cited

U.S. PATENT DOCUMENTS

| | | | |
|---|---|---|---|
| 5,140,269 A | 8/1992 | Champlin | |
| 8,738,311 B2 * | 5/2014 | Wu | G01R 31/367 |
| | | | 702/63 |

(Continued)

*Primary Examiner* — Nathaniel R Pelton
*Assistant Examiner* — Manuel Hernandez
(74) *Attorney, Agent, or Firm* — Quinn IP Law

(57) ABSTRACT

Systems and methods are disclosed for estimating a state of a battery system such as a current-limited state of power and/or a voltage-limited state of power using a battery system model incorporating a nonlinear resistance element. Parameters of elements included in a battery cell model associated with a nonlinear resistance of a battery cell may be directly parameterized and used in connection with state estimation methods. By accounting for the nonlinear effect, embodiments of the disclosed systems and methods may increase available battery power utilized in connection with battery system control and/or management decisions over a larger window of operating conditions.

13 Claims, 7 Drawing Sheets

(51) Int. Cl.
*H01M 10/48* (2006.01)
*H01M 10/42* (2006.01)

(56) References Cited

U.S. PATENT DOCUMENTS

| | | | |
|---|---|---|---|
| 9,067,504 B1 | 6/2015 | Lee | |
| 9,417,290 B1* | 8/2016 | Wang | G06F 15/00 |
| 9,658,291 B1* | 5/2017 | Wang | G01R 31/3624 |
| 10,094,882 B2* | 10/2018 | Kawai | G01R 31/367 |
| 2002/0109504 A1* | 8/2002 | Champlin | H01M 10/48 324/426 |
| 2003/0076109 A1 | 4/2003 | Verbrugge | |
| 2003/0094321 A1 | 5/2003 | Hirata | |
| 2004/0128089 A1 | 7/2004 | Barsoukov | |
| 2004/0162683 A1 | 8/2004 | Verbrugge | |
| 2004/0239332 A1 | 12/2004 | Mackel | |
| 2008/0054848 A1* | 3/2008 | Yun | G01R 31/3651 320/134 |
| 2009/0109046 A1 | 4/2009 | Gielniak | |
| 2010/0085057 A1* | 4/2010 | Nishi | H01M 10/44 324/427 |
| 2010/0121591 A1 | 5/2010 | Hall | |
| 2011/0224928 A1 | 9/2011 | Lin | |
| 2011/0264381 A1 | 10/2011 | Gering | |
| 2011/0301931 A1 | 12/2011 | Gering | |
| 2012/0101674 A1* | 4/2012 | Wang | G01R 31/3651 701/22 |
| 2012/0119749 A1 | 5/2012 | Iida | |
| 2012/0143585 A1* | 6/2012 | Barsukov | G01R 31/367 703/18 |
| 2013/0076314 A1 | 3/2013 | Nagakura | |
| 2013/0110429 A1* | 5/2013 | Mitsuyama | H01M 10/48 702/63 |
| 2013/0138369 A1* | 5/2013 | Papana | G01R 31/3644 702/63 |
| 2014/0111214 A1 | 4/2014 | Sejima | |
| 2014/0278167 A1* | 9/2014 | Frost | B60L 58/16 702/63 |
| 2015/0197164 A1 | 7/2015 | Lee | |
| 2018/0031642 A1* | 2/2018 | Sung | H02J 7/0052 |
| 2018/0045788 A1* | 2/2018 | Kawai | H01M 10/4285 |
| 2018/0095141 A1* | 4/2018 | Wild | G01C 21/3407 |
| 2019/0064276 A1* | 2/2019 | Kawai | G01R 31/36 |

* cited by examiner

BATTERY STATE ESTIMATION SYSTEMS AND METHODS USING A NONLINEAR RESISTANCE ELEMENT

RELATED APPLICATIONS

This application is a continuation-in-part of co-pending U.S. patent application Ser. No. 14/275,553 filed on May 12, 2014, and titled "SYSTEMS AND METHODS FOR DETERMINING BATTERY SYSTEM POWER CAPABILITY," which is incorporated herein by reference in its entirety.

TECHNICAL FIELD

This disclosure relates to systems and methods for estimating a state of a battery system. More specifically, but not exclusively, the systems and methods disclosed herein relate to estimating a state of a battery system using a battery system model incorporating a nonlinear resistance element.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Information regarding a state of a battery system may be utilized in modeling battery system performance and/or in connection with battery system control and/or management decisions. A battery state estimation ("BSE") system may be used to predict a state of a battery system. Under most operating conditions, a battery system may have a power capability that exceeds the capabilities of associated motors and power electronics in a vehicle. For low temperature operation, however, electrochemical processes at work within the battery system may be slowed to a point that there remains little margin to meet the power demands of the system. An accurate estimate of battery system power capability may be important in such a situation. A small over-prediction of power capability can lead to failed attempts to crank an engine or erratic vehicle acceleration, while a similarly small under-prediction of power can temporarily disable the propulsion system. Therefore, a BSE system that properly interprets the effects of low temperature on the battery is desirable.

SUMMARY

Systems and methods disclosed herein may provide for improved determination of a state of a battery system including, without limitation, a state of charge ("SOC") of a battery system, a state of power ("SOP") of a battery system (e.g., a maximum available power of a battery system). Information regarding power capability of a battery system may be utilized in connection with a variety of applications including, without limitation, modeling battery system performance and/or battery system control and/or management decisions.

Temperature may affect the thermodynamics and kinetics of battery energy conversion processes. First principles models of mass transport, charge transfer, and capacitive phenomena may represent the decline of power capability with falling temperature. Such models, however, may be quite complex and may involve a great deal of computational throughput. A more computationally efficient approach to battery state estimation for real-time, onboard vehicle use may utilize an equivalent circuit model ("ECM"), which in a semi-empirical manner may provide simple electrical analogies for electrochemical processes. Through a combination of series and parallel resistors, capacitors, and a voltage source, an equivalent circuit may approximate the response of battery voltage to a current flow. On the whole, this approach can provide an effective representation of the battery because of the tuning flexibility afforded by having a sufficient number of circuit components and parameters.

Certain systems and methods using an ECM in connection with BSE methods may utilize a regressed linear average resistance in the model. For example, nonlinear behavior of a battery cell may be measured at 50% SOC for a range of temperatures. Based on such measured behavior, a linear average resistance in the circuit model may be regressed. As a battery cell ages, the change in the linear average resistance may be used to rescale to account for nonlinear effects in the cell.

Consistent with embodiments disclosed herein, parameters of ECM elements associated with a nonlinear resistance of a battery cell may be directly parameterized and used in connection with BSE methods. By accounting for the nonlinear effect, embodiments of the disclosed systems and methods may increase available battery power utilized in connection with battery system control and/or management decisions over a larger window of operating conditions (e.g., a wider range of operating temperatures including colder operating temperatures).

In some embodiments, the disclosed BSE systems and methods may estimate a higher SOP than what may be estimated if a linear model was used, which may be closer to an actual SOP of the battery system. Improving the ability to estimate SOP of the battery system may, among other things, allow a vehicle control system to more fully utilize the actual capacity of the battery system, thereby allowing for greater power from the battery and/or use of a smaller battery for a same power specification. In certain embodiments, this may provide greater battery weight and/or cost flexibility in a battery system included in a vehicle.

As discussed above, BSE methods consistent with the disclosed embodiments may be performed by a BSE system and/or another battery control and/or monitoring system using, at least in part, an ECM of a battery system. Among other things, the circuit model may incorporate elements modeling ohmic resistance, charge transfer, and/or mass transfer processes in a battery system. In certain embodiments, such processes may be modeled by resistors and/or resistor/capacitor pairs included in the circuit model. For example, in some embodiments, an ECM element modeling certain nonlinear effects in a battery system may comprise a nonlinear resistance element and/or a parallel capacitor element.

In certain embodiments, a method of determining a state of a battery system may include In certain embodiments, a method of estimating a state of a battery system (e.g., a SOP, a current-limited SOP, a voltage-limited SOP, a SOC of the battery system, etc.) using a nonlinear element configured to model a nonlinear voltage to current response of the battery system may include measuring a terminal voltage of the battery system and a current through the battery system. Parameters of a battery system model may be determined based, at least in part, on the measured terminal voltage of the battery system and the measured current through the battery system. The battery system model may comprise at least one nonlinear element configured to model a nonlinear voltage to current response of the battery system. In some embodiments, parameters associated with the nonlinear element may be determined based on a Butler-Volmer model describing the kinetics of charge transfer in the battery system. In further embodiments, parameters associated with the nonlinear element may be determined based on a piecewise polynomial approximation of a nonlinear voltage response of the battery system.

In certain embodiments, the battery system model may comprise an ECM and the nonlinear element may comprise a nonlinear resistor and/or a linear capacitor disposed in parallel with the nonlinear resistor. The battery system model may further comprise an element modeling an OCV of the battery system and a linear element disposed in series with the nonlinear element. In some embodiments, linear element comprises a plurality of serially coupled parallel resistor capacitor pairs. Certain elements of the battery system model may, among other things, model ohmic resistance, charge transfer, and mass transfer processes of the battery system.

A predicted battery system voltage may be determined based, at least in part, on the parameterized battery system model, and the state of the battery system may be estimated based on the predicted battery system voltage. In certain embodiments, a control action in a vehicle associated with the battery system may be implemented based on the estimated battery system state. For example, an action associated with setting a maximum allowed vehicle acceleration, an action associated with initiation of an electric drivetrain system of the vehicle, an action associated with a regenerative braking acceptance setting of the vehicle, and/or the like may be implemented based, at least in part, on the estimated battery system state.

In certain embodiments, the aforementioned method and/or aspects therefore may be performed by control electronics associated with a battery system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
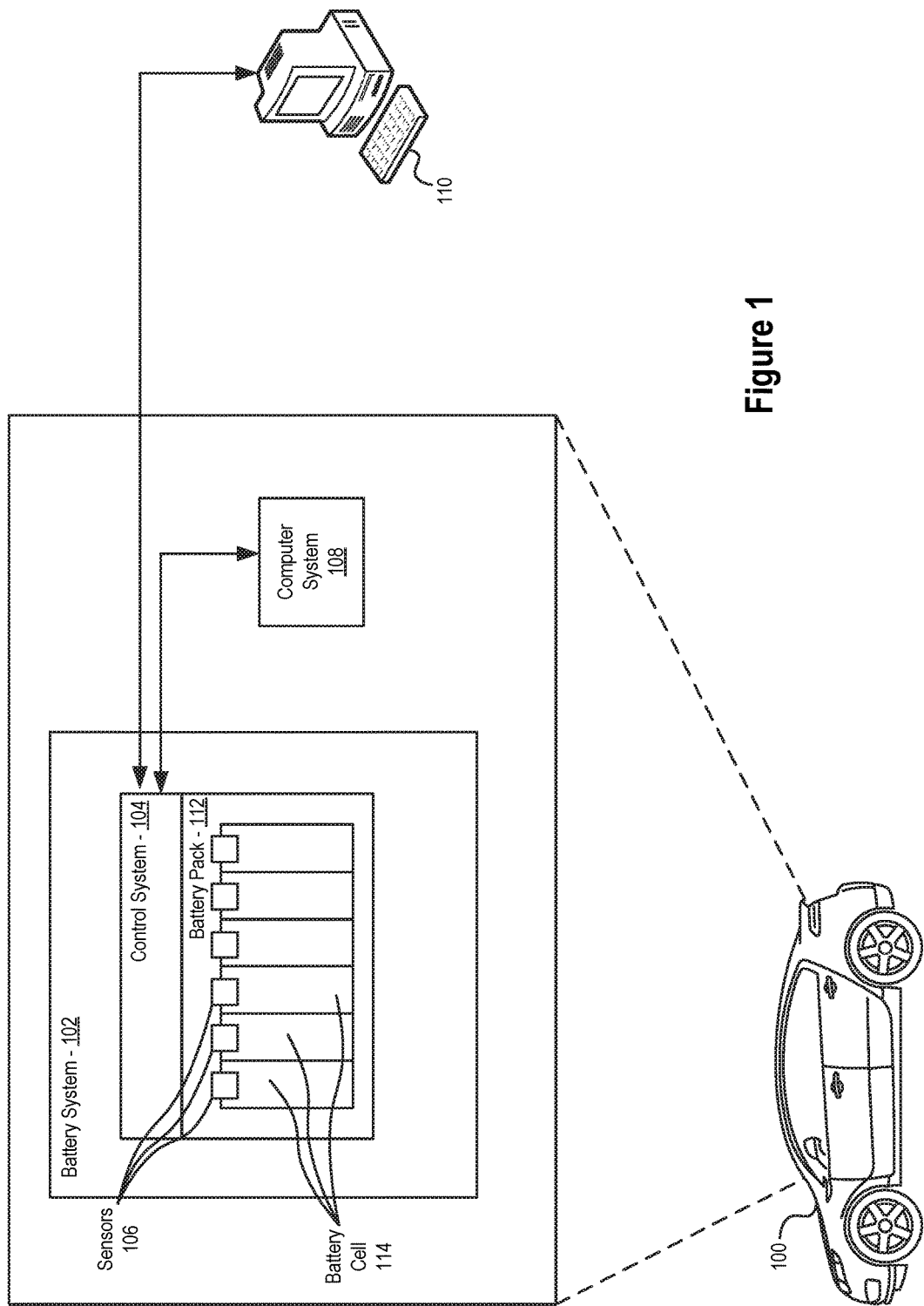
FIG. 1 illustrates an exemplary system for determining power capability of a battery system included in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved estimation and/or determination of information relating to a state of a battery system including, without limitation, a SOP (e.g., a power capability) and/or a SOC of a battery system. Battery state determinations may be performed by a BSE system and/or another battery control, monitoring, and/or management system. In some embodiments, a circuit model of a battery system that includes parameters and/or elements modeling nonlinear effects in the battery system may be utilized in connection with battery state determinations.

In certain embodiments, the circuit model may be formed by a placing in series an open circuit voltage element, a linear element, and a nonlinear element comprising a nonlinear resistance. The nonlinear resistance may model an effect where the slope of voltage relative to current in a battery system may decrease as the magnitude of the current increases, which may be particularly prevalent at low temperatures. If this nonlinearity is ignored, the regressed resistance value at lower currents, where a vehicle may operate a large percentage of the time, may overestimate the voltage drop that occurs at higher currents. This error may lead to less accurate estimate of a SOC of the battery system and/or underestimates of available discharge power at cold temperatures. Consistent with embodiments disclosed herein, such errors may be reduced by adapting the parameters of a nonlinear element included in an ECM used to model the battery system. Initial parameters for the ECM may be measured through characterization testing of a new battery and/or cell and may be adapted over time (e.g., when larger current events occur such as rapid vehicle starts and/or stops).

Consistent with embodiments disclosed herein, using circuit model parameters that model nonlinear effects in a battery system including, for example, nonlinear resistance, may increase the accuracy of associated BSE determinations. Among other things, this increase in accuracy may allow for more consistent drivability and/or improved performance of a vehicle associated with a battery system, particularly during low-temperature operation. In some embodiments, the disclosed systems and methods for determining a power capability of a battery system may allow for increased discharge (e.g., allowing quicker acceleration) and/or charge (e.g., improving regenerative braking or recharging operations) of the battery system than conventional methods, thereby improving operation of an associated vehicle. For example, by accurately determining a maximum power capability of a battery system associated with a vehicle, acceleration of the vehicle may be improved, hybrid-electric vehicle functionality may initiate earlier in a low-temperature drive cycle, regenerative braking acceptance may be increased for better vehicle efficiency, and the battery system may be more fully utilized.

FIG. 1 illustrates an exemplary system for determining power capability of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine battery system state information including, for example, battery SOP and/or SOC information. In certain embodiments, the battery control system 104 may be communicatively coupled with one or more sensors 106 (e.g., voltage sensors, current sensors, and/or the like, etc.) and/or other systems (e.g., vehicle computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC and/or a state of health ("SOH"), estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., vehicle computer system 108) included in the vehicle 100. For example, the battery control system 104 may be communicatively coupled with an internal vehicle computer system 108 and/or an external computer system 110 (e.g., via a wired and/or wireless telecommunications system or the like). In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC and/or SOH information, battery power capability information, battery operating time information, battery cycle information, battery operating temperature information, and/or any other information regarding the battery system 102 that may be utilized in connection with determining battery system state information.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a Na—NiCl$_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Information measured by sensors 106 may be provided to the battery control system 104 and/or one or more other systems (e.g., vehicle computer system 108 and/or external computer system 110). Using the information, the battery control system 104 and/or any other suitable system may coordinate the operation of battery system 102 (e.g., charging operations, discharging operations, balancing operations, etc.). The battery control system 104, vehicle computer system 108, external computer system 110, and/or any other suitable system implementing BSE methods may further utilize such information in connection with the disclosed embodiments to determine battery system 102 state including, for example, battery system power capability and/or SOC as part of monitoring, control, characterization, and/or modeling activities.

Figure 2:
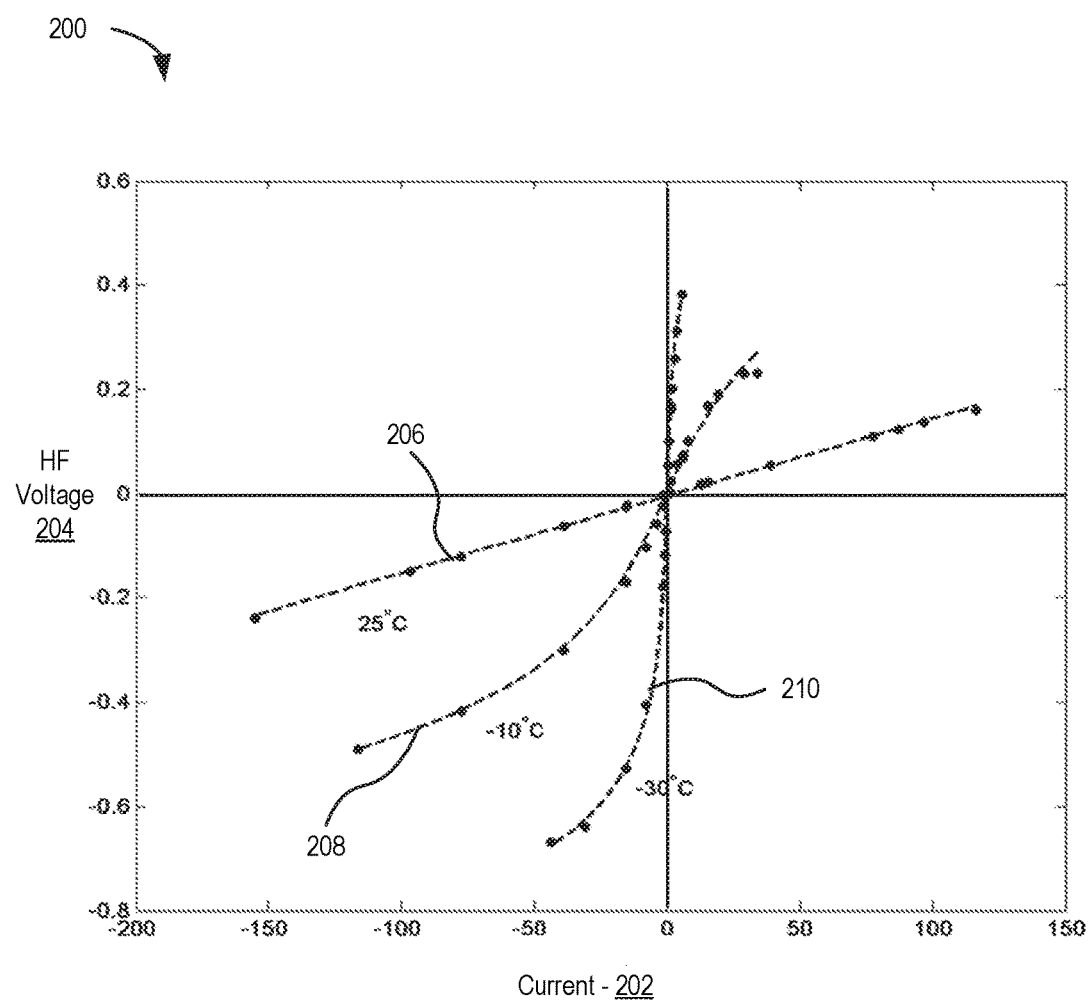
FIG. 2 illustrates a graph showing an exemplary relationship between high frequency voltage and current in an exemplary battery cell consistent with embodiments disclosed herein.

FIG. 2 illustrates a graph 200 showing an exemplary relationship between high frequency ("HF") voltage and current in an exemplary battery cell (e.g., a Li-Ion battery cell) consistent with embodiments disclosed herein. The x-axis 202 in the graph 200 represents current (e.g., I) and the y-axis 204 represents HF voltage (e.g., V). Relationships between HF voltage and current at three exemplary temperatures are represented by lines 208-210. Particularly, graph 200 includes a relationship between current 202 and HF voltage 204 of a battery cell at 25° C. 206, at −10° C. 208, and at −30° C. 210.

As can be seen in graph 200, the relationship between current 202 and HF voltage 204 of the battery cell becomes increasingly nonlinear with lower temperatures. Consistent with embodiments disclosed herein, this nonlinearity may be accounted for using a nonlinear element (e.g., a nonlinear resistance element) included in an ECM used to model the behavior of the battery cell in connection with BSE methods. In some embodiments, the relationship between current 202 and HF voltage 204 of a battery cell may be described using a Butler-Volmer model describing the kinetics of charge (i.e., electron) transfer in a battery system, which may be expressed according to the following:

$$I = A \cdot j_0 \left\{ \exp\left[\frac{\alpha_1 nF}{RT}(V-V_0)\right] - \exp\left[-\frac{\alpha_2 nF}{RT}(V-V_0)\right] \right\} \quad \text{Eq. 1}$$

where
I=current
$j_o$=exchange current density
A=electrode surface area
$\alpha_{1,2}$=transfer coefficients for the oxidation and reduction processes
n=number of electrons transferred in the electrochemical reaction
F=Faraday constant
R=universal gas constant
T=absolute temperature
$V_o$=equilibrium/open-circuit voltage of the cell
V=voltage of the cell.

According to the Butler-Volmer model, resistance may decrease for larger deviations from the open-circuit voltage ("OCV"). Consistent with embodiments disclosed herein, the Butler-Volmer model may be used in connection with parameterizing nonlinear elements of an ECM to account for nonlinear behavior of the cell (e.g., low temperature behavior or the like).

Figure 3:
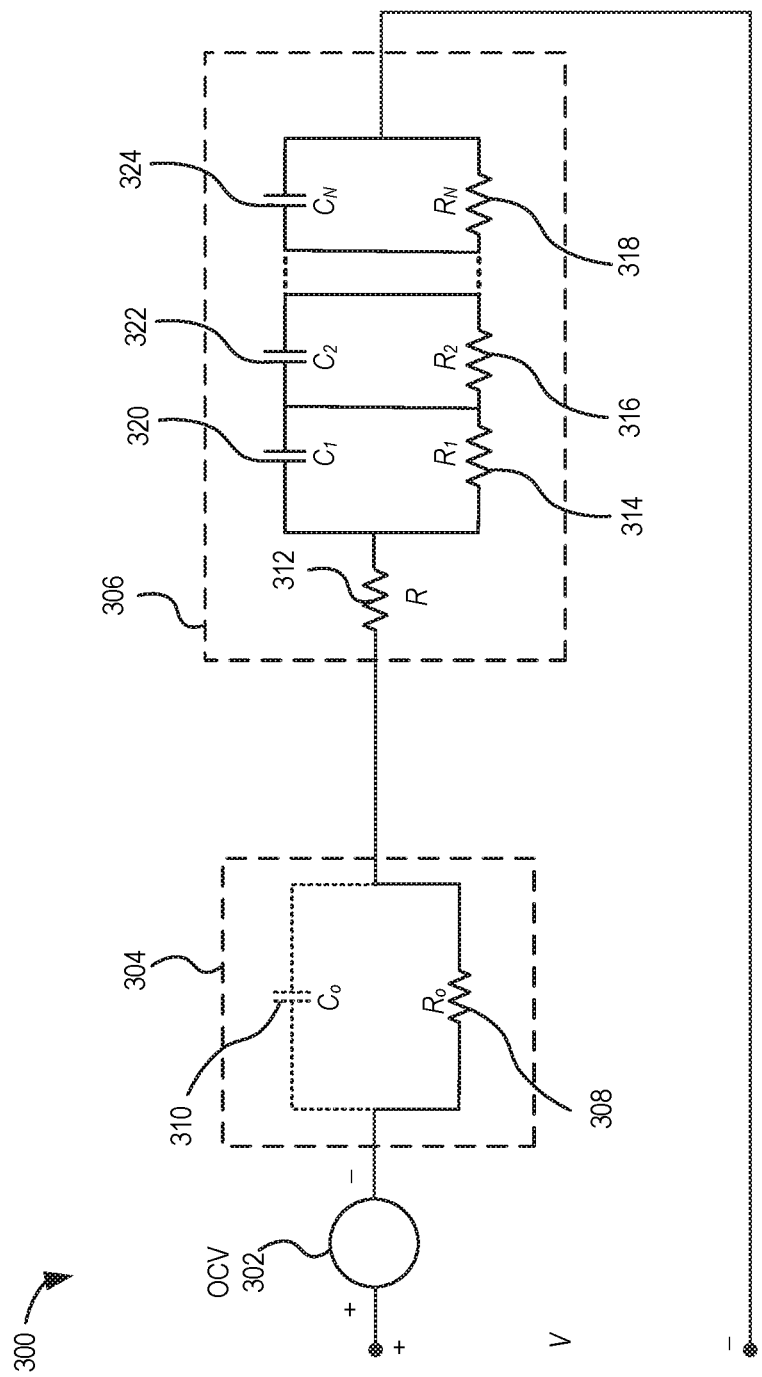
FIG. 3 illustrates an exemplary circuit model for modeling a battery system consistent with embodiments disclosed herein.

FIG. 3 illustrates an exemplary circuit model 300 for modeling a battery system consistent with embodiments disclosed herein. In certain embodiments, a circuit model 300 representation of a battery system may model certain electrochemical processes in a battery system that may be utilized in connection with BSE and/or other battery information determination systems and methods. The illustrated model 300 may include a voltage source 302 modeling an OCV and/or equilibrium voltage, $V_o$, a nonlinear element 304, and/or a linear element 306 connected in series. Among other things, the circuit model may incorporate elements modeling nonlinear behavior, ohmic resistance, charge transfer, and/or mass transfer processes in a battery system.

The voltage across the circuit model 300 modeling the voltage of an associated battery and/or battery cell may comprise the sum of the OCV 302, a voltage across the nonlinear element 304, and a voltage across the linear element 306. In some embodiments, the open circuit voltage 302, modeling an equilibrium voltage of the battery and/or battery cell, may be determined based on a tabulated OCV curve associated with the battery and/or cell (e.g., obtained via characterization testing and/or the like), and may be adjusted to account for aging of the battery and/or cell.

The linear element 306 may comprise resistor 312, R, which may model ohmic resistance in the battery system. Resistor 312 may be connected in electrical series with one or more parallel resistor-capacitor pairs (e.g., a pair comprising resistor $R_1$ 314 and capacitor $C_1$ 320, a pair comprising resistor $R_2$ 316 and capacitor $C_2$ 322, and a pair comprising resistor $R_N$ 318 and capacitor $C_N$ 324).

Although the linear element 306 illustrated in connection with model 300 comprises a resistor 312 coupled in series with three parallel resistor-capacitor pairs, it will be appreciated that any suitable number of parallel resistor-capacitor pairs may be used in connection with the disclosed embodiments. Moreover, any suitable element 306 modeling linear behavior of the battery system may be used in connection with the disclosed embodiments, including elements comprising any suitable network of resistors, capacitors, and/or inductors, configuration of serially-coupled parallel resistor-resistor capacitor pairs, serially-coupled resistors and/or capacitors, elements modeling a general Laplace transform for impedance, elements modeling a general linear ordinary differential equation, elements modeling a Finite Impulse Response filter, and/or the like.

A nonlinear element 304 of the model 300 may include a nonlinear resistor 308 coupled in electrical series with the OCV 302 and the linear element 306. In some embodiments, the nonlinear resistor 308 may model a nonlinear relationship between current and HF voltage of a battery system that may be exhibited at lower temperatures. In certain battery systems (e.g., relatively high power batteries that employ relatively high surface area electrodes), the Butler-Volmer effect may have a non-negligible associated capacitance. To model this effect in such systems, the nonlinear element 304 may further comprise a linear capacitor $C_o$ 310 coupled in parallel with the nonlinear resistor 308. Consistent with embodiments disclosed herein, parameters associated with the elements of the nonlinear elements 302 (e.g., resistor 308 and/or capacitor 310) may be parameterized and used in connection with BSE methods.

Figure 4:
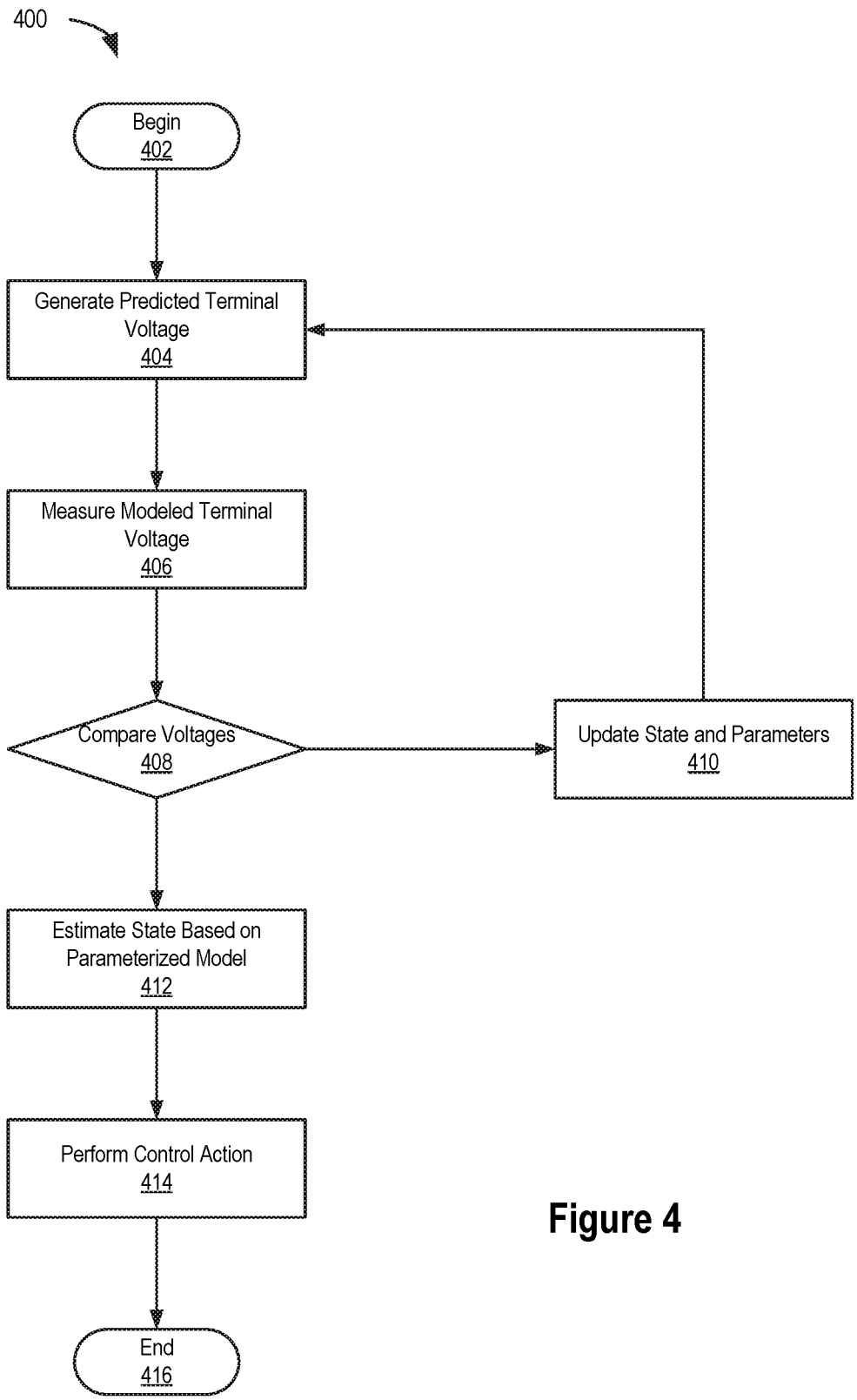
FIG. 4 illustrates a flow chart of an exemplary method for determining a state of a battery system consistent with embodiments disclosed herein.

FIG. 4 illustrates a flow chart of an exemplary method 400 for determining a state of a battery system consistent with embodiments disclosed herein. In certain embodiments, one or more of the illustrated elements of method 400 may be performed by and/or implemented using a battery control system, a vehicle computer system, an external computer system, and/or any other system or combination of systems configured to implement BSE methods and/or, monitor, model, and/or otherwise characterize a state of a battery system including, without limitation, a SOC and/or a SOP of a battery system.

Consistent with embodiments disclosed herein, elements included in a nonlinear element of a circuit model used in connection with estimating a state of the battery system (e.g., a nonlinear resistor and/or associated capacitor) may be parameterized. Nonlinear element parameters, which may be denoted herein as $p_1, p_2, p_N$, may vary with a SOC of an associated modeled battery system, temperature of the battery system, and/or age of the battery system, and may be continuously updated to more accurately model the battery system based on measured information associated with the battery system.

Embodiments disclosed herein may utilize a variety of suitable methods in connection with parametrizing elements included in a nonlinear element of a model used to estimate a state of a battery system. For example, in some embodiments, a Butler-Volmer model, as expressed in Eq. 1, may be used in connection with generating and updating parameters associated with a nonlinear element of a model. In other embodiments, other notations of Butler-Volmer model may be used, including the simplified notation expressed below:

$$I = p_1\{\exp[p_2 V_{RO}] - \exp[-p_3 V_{RO}]\} \quad \text{Eq. 2}$$

where $V_{RO}$ is the voltage across the nonlinear element of the model.

In further embodiments, the symmetric form or the inverted symmetric form of the Butler-Volmer model (i.e., $p_2 = p_3$) may be used, expressed respectively as follows:

$$\text{Symmetric: } I = p_1 \sin h(p_2 V_{RO}) \quad \text{Eq. 3}$$

$$\text{Inverted symmetric: } V_{RO} = q_1 a \sin h(q_2 I), q_1 = 1/p_2, q_2 = 1/p_1 \quad \text{Eq. 4.}$$

In other embodiments, a power series of the Butler-Volmer model may be used in connection with parametrizing elements included in a nonlinear element of a model (e.g., a general power series $V_{RO} = p_1 I + p_2 I^2 + p_3 I^3 + \ldots$ and/or a symmetric power series $V_{RO} = p_1 I + p_3 I^3 + p_5 I^5 + \ldots$). In yet further embodiments, a piecewise polynomial parametrization method including, without limitation, piecewise linear and/or B-splines polynomial parametrization method may be used in connection with the disclosed embodiments. It will be appreciated that the above-described parameterization methods are examples of possible parameterization methods that may be used in connection with the disclosed embodiments, and that any other suitable method for approximating a nonlinear function and generating associated model parameters may also be used in connection with the disclosed systems and methods.

The exemplary method 400 illustrated in FIG. 4 may initiate at 402. At 404, a predicted terminal voltage of the battery system based on the model may be generated. In at least one exemplary implementation of the disclosed embodiments, a linear circuit model included in an ECM may comprise one or more serially-coupled resistor and capacitor parallel pairs. In such an implementation, P may represent an entire set of parameters associated with an ECM and X may be a vector of associated voltage states (e.g., voltages across various elements of the ECM) expressed according to $X = [V_o, v_1, \ldots, v_N]$, where $v_N$ is the voltage across the nth capacitor of the ECM.

The ECM may predict X at time $t_{k+1}$ from its prior value and that of the current (i.e., $X_{k+1} = f(X_k, I_k, P_k)$). The predicted terminal voltage of the battery system based on the model may be generated according to:

$$V_k = g(X_k) + h(I_k, P_k) \quad \text{Eq. 5}$$

where $g(X) = V_o + v_1 + \ldots + v_N$
and $h(I, P)$ is the parameterized nonlinear resistance.

The terminal voltage of the actual battery system modeled by the ECM may be measured at 406. A current flowing through the battery system may be further measured at 406. At 408, the predicted voltage, $V_k$, may be compared to the measured terminal voltage. If the difference is greater than a threshold, the method 400 may proceed to 410, where the estimated state $X(t_k)$ and parameters P may be recursively updated so that the model more closely correlates with the measured terminal voltage. In some embodiments, a recursive lease squares method that may utilize weighting factors and/or a forgetting factor may be utilized to update the estimated state $X(t_k)$ and parameters P. In further embodiments, a suitable filter such as, for example, an extended Kalman filter and/or an unscented Kalman filter may be utilized to update the estimated state $X(t_k)$ and parameters P.

If the difference between the predicted voltage and the measured terminal voltage are less than the threshold, indicating suitable correlation between the measured voltage and the predicted voltage, the method 400 may proceed to 412. At 412, a state of the battery system may be estimated based on the parameterized model (e.g., a SOC and/or a SOP). To estimate a SOC, the method 400 may utilize an estimated OCV, $V_o$. For example, when $X(t_k)$ is estimated in the above-described process, an estimate of the OCV may be obtained as OCV may be a voltage state element (i.e., $X = [V_o, v_1, \ldots, V_N]$). Based on the estimated OCV, a corresponding SOC may be determined via a look-up table associating OCV and SOC and/or any other suitable method. In some embodiments, the look-up table may be generated based on an OCV curve generated via characterization testing of a new battery. The look-up table may further include OCV curve information that may adjust over time to reflect loss of capacity as the battery ages In certain embodiments, a predicted SOP may be used in connection with battery and/or vehicle control decisions. For example, a predicted $SOP_{\Delta t}$, indicating a power that can be drawn from a battery after $\Delta t$ seconds if maximum battery power is drawn over that interval may be used in connection with battery and/or vehicle control decisions. In certain embodiments, SOP may be limited by an allowed current-voltage window, which may be temperature dependent. Additional, limits may be set to avoid certain degradation phenomenal in the battery system including, without limitation, lithium plating and/or undesirable side reactions.

A current-limited SOP, SOPI, may be obtained by using a known current limit of the battery system, I*, and the ECM to predict $X(t+\Delta t)$ and $V(t+\Delta t)$. The current-limited SOP, SOPI, may then be obtained based on the following:

$$SOPI = P(t+\Delta t) = I^* \cdot V(t+\Delta t) \quad \text{Eq. 6}$$

In some embodiments, the SOPI may be calculated as a sum of the power associated with an OCV of the ECM, $P_{OCV}$, a power associated with the linear element of the ECM, $P_L$, and a power associated with the nonlinear element, $P_{RO}$. For a constant current, I*, the voltage drop across the nonlinear element may be constant (i.e., $V_{RO} = h(I^*, P)$). Accordingly, the power associated with the nonlinear element may be expressed according to:

$$P_{RO} = I^* \cdot h(I^*, P) \quad \text{Eq. 7}$$

In further embodiments, to obtain a current-limited SOP of the battery system, numerical integration of an ordinary differential equation associated with the ECM may be used. For example, numerical integration may be utilized in connection with an ECM that includes a capacitor disposed in parallel with a nonlinear resistor, as described above.

A voltage-limited SOP, SOPV, may be determined by simulating the battery system using the ECM for $\Delta t$ seconds with the terminal voltage held constant at a limit, V*. Under such conditions, the voltage across the nonlinear element may be expressed according to:

$$V_{RO}(t) = V^* - OCV(t) - V_L(t) \quad \text{Eq. 8}$$

and the current through the ECM may be expressed according to:

$$I(t) = h^{-1}(V_{RO}(t), P) \quad \text{Eq. 9}$$

I(t) may be used to numerically integrate an ordinary differential equation associated with the ECM, and SOPV may be estimated according to:

$$SOPV = V^* \cdot I(t+\Delta t) \quad \text{Eq. 10}$$

In certain embodiments, an estimated SOP for the battery system using in connection with battery and/or vehicle control operations may comprise the lesser of the SPOI and the SOPV.

At least one battery system and/or vehicle control action may be performed based, at least in part, on the battery state estimated at 414. For example, an action associated with limiting a maximum allowed vehicle acceleration, an action associated with initiation of an electric drivetrain system, an action associated with a regenerative braking acceptance setting of the vehicle, and/or any other desirable control action may be performed based on the estimated battery state. The method 400 may proceed to terminate at 416.

Figure 5:
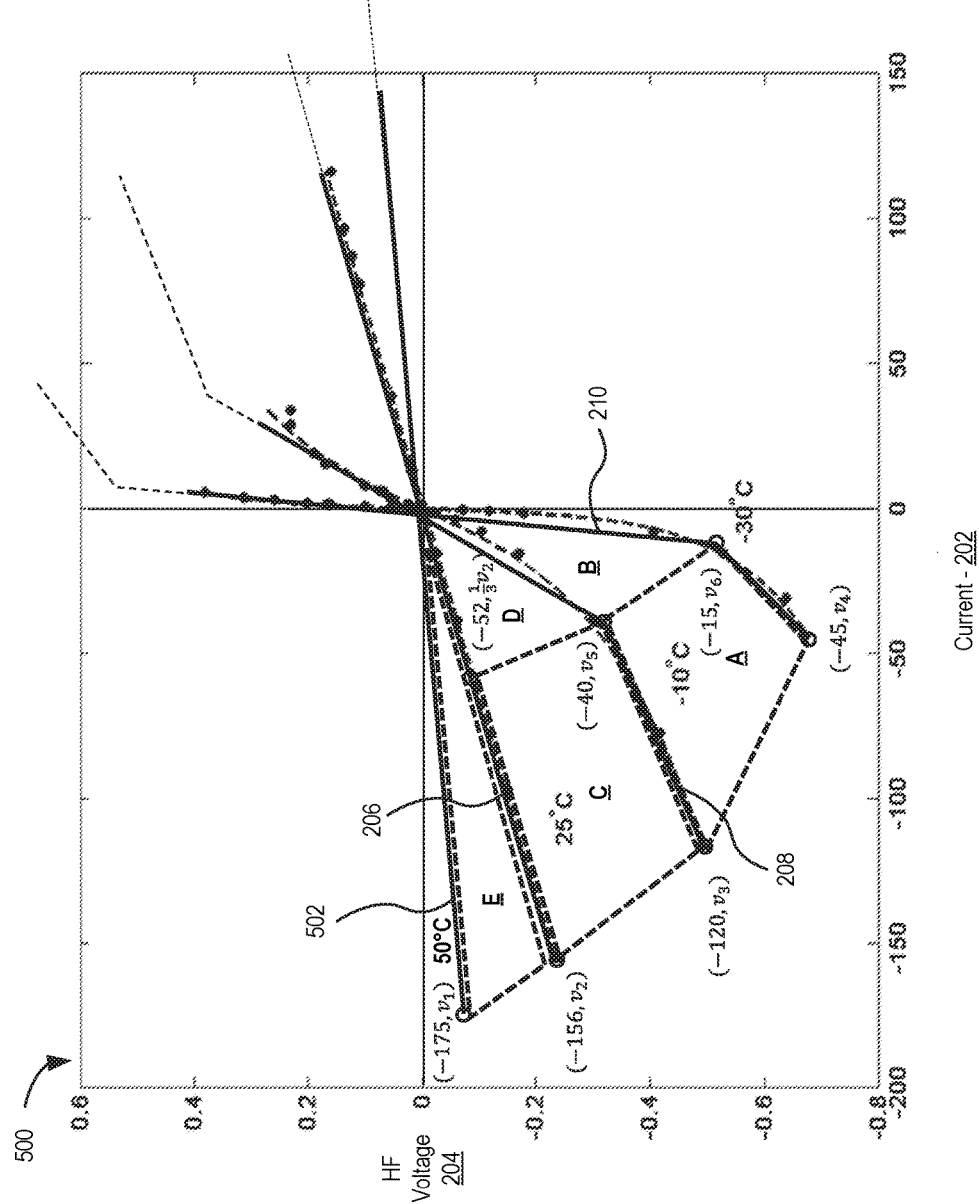
FIG. 5 illustrates an exemplary conceptual diagram for determining parameters of a nonlinear resistance element included in an exemplary circuit model for modeling a battery system consistent with embodiments disclosed herein.

FIG. 5 illustrates an exemplary conceptual diagram 500 for determining parameters of a nonlinear resistance element included in an exemplary circuit model for modeling a battery system consistent with embodiments disclosed herein. Particularly, diagram 500 illustrates estimation of parameters of a nonlinear resistance element of a circuit model utilizing a piecewise polynomial function estimation process. Like a graph 200 of FIG. 2, diagram 500 shows an exemplary relationship between HF voltage and current in an exemplary battery cell (e.g., a Li-Ion battery cell) consistent with embodiments disclosed herein. The x-axis 202 in the graph 200 represents current (e.g., I) and the y-axis 204 represents HF voltage (e.g., V). Relationships between HF voltage and current at four exemplary temperatures, 50° C., 25° C., −10° C., and −30° C., are represented by lines 502, 206, 208, and 210, respectively.

At various temperatures, there may be a maximum allowed discharge current, which for the illustrated temperatures 50° C., 25° C., −10° C., and −30° C., may be 175 A, 156 A, 120 A, and 45 A respectively. For lower temperatures, such as 25° C., −10° C., and −30° C., a second discharge current may be selected at some fraction of the maximum discharge current, such as, for example, one-third, that is, at 52 A, 40 A, and 15 A. At higher temperatures, the current-voltage relation may be substantially linear, so a second current level may not be used. At each selected current and temperature, a corresponding voltage is may be stored. In the illustrated exemplary diagram 500, there are six independent voltage values, $v_1, \ldots, v_6$. The solid line segments in FIG. 5 show how $v_1, \ldots, v_6$ may be chosen so as to approximate the voltage response curves illustrated in connection with graph 200 shown in in FIG. 2, using piecewise linear approximations.

The temperature/current dependent voltage response of the battery system or cell may be generally odd-symmetric with respect to current, I—that is $V(I, T)=-V(-I, T)$, where T is the battery system or cell temperature. Under such conditions, the six values $v_1, \ldots, v_6$ may together constitute the full set of parameters for the voltage response of the nonlinear resistance element. If the response of the battery is found to be non-symmetric with respect to current, more parameters may be introduced to represent the voltage response for positive currents, and the temperatures and charge currents selected for constructing the approximation may or may not be symmetric to those used for discharge currents.

A Li-Ion battery may have a larger allowed discharge current than charge current. The dashed portion of the lines included in diagram 500 for positive currents represent counterparts to discharge currents that exceed the allowed charge current. In some embodiments, these conditions may be implied by symmetry, although an associated battery may not necessarily operate at such conditions. If symmetry is not imposed on the functional representation, voltage parameters may be introduced based on the actual range of use of the battery.

Figure 6:
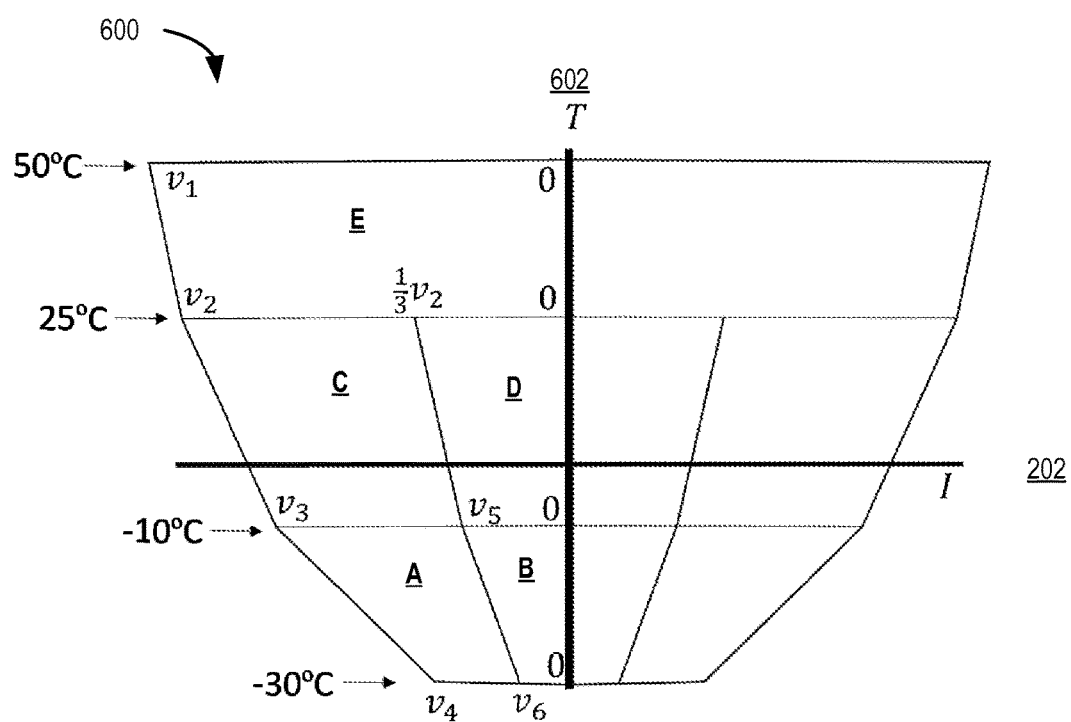
FIG. 6 illustrates the conceptual diagram of FIG. 5 shown in a current vs. temperature representation consistent with embodiments disclosed herein.

FIG. 6 illustrates another conceptual diagram 600 showing certain information including in the diagram 500 of FIG. 5 in a current 202 vs. temperature 602 representation consistent with embodiments disclosed herein. The combinations of discharge current and cell temperature in the illustrated diagram 600 may fall into one of five regions or quadrilaterals, labeled A, B, C, D, and E in both diagram 600 and diagram 500 of FIG. 5. In each of these regions, a corresponding approximation to the voltage drop the nonlinear resistor of the model may be obtained using bilinear interpolation between the values of the voltage drop at the corners of the region, with the voltage drop for I=0 assumed to be zero. If the voltage drop is odd-symmetric with respect to current, the diagram 600 may be mirrored across the I=0 axis with the corner voltages negated, otherwise the regions and corner voltages can be independent for I>0 and I<0. In either case, the diagram 600 may be constructed so that it includes the entire range of operating currents and temperatures. In certain embodiments, the voltages stored for the corners of the regions are not necessarily the exact values for the corresponding current and temperature, but rather, these may be adjusted so as to give the best approximation of the voltage response over the adjacent region or regions.

The regions, A, B, C, D, and E, in the diagram 600 can be subdivided more finely to achieve a closer approximation to the true response of the battery, or conversely, a more coarse subdivision can be used, thereby reducing computation and memory requirements if such a coarse subdivision provides a sufficiently accurate model. It will be appreciated that the one-third fractional division described above for currents at low temperatures is illustrative only, as the vertices of the diagram 600 can be placed in any suitable manner that provides a good approximation to the high-frequency voltage response.

In some embodiments, HF voltage response of a battery may be a function of a SOC of the battery system. If the change in the HF voltage response as SOC varies is large enough, diagrams similar to that shown in FIG. 6 may be constructed at a plurality of SOC values. These diagrams may be interpolated for intermediate values of SOC in connection with parameterizing nonlinear resistance of a battery system.

Certain of the aforementioned embodiments may approximate nonlinear voltage of a battery system as a piecewise linear function of current and various temperatures. In other embodiments, to better approximate a smoothly curving response of a battery system, higher order polynomial approximations may be utilized, such as piecewise quadratic or piecewise cubic functions. Similarly, the approximation of the voltage as a function of current, temperature, and SOC may be performed using any suitable technique for parametrizing a multivariate function, such as, for example, higher order methods used in connection with finite element computations. For this purpose, the operating range of current, temperature, and SOC may be subdivided into tetrahedra, generalized cubes, convex polyhedra, and/or any other 3-D geometric forms that might be suitable for use in connection with a selected method. If a dependence on SOC is weak enough to be ignored, the nonlinear voltage response may become a function of current and temperature, and the (I, T)-plane may be subdivided into triangles, quadrilaterals, convex polygons, and/or or any other 2-D geometric forms that might be suitable.

Figure 7:
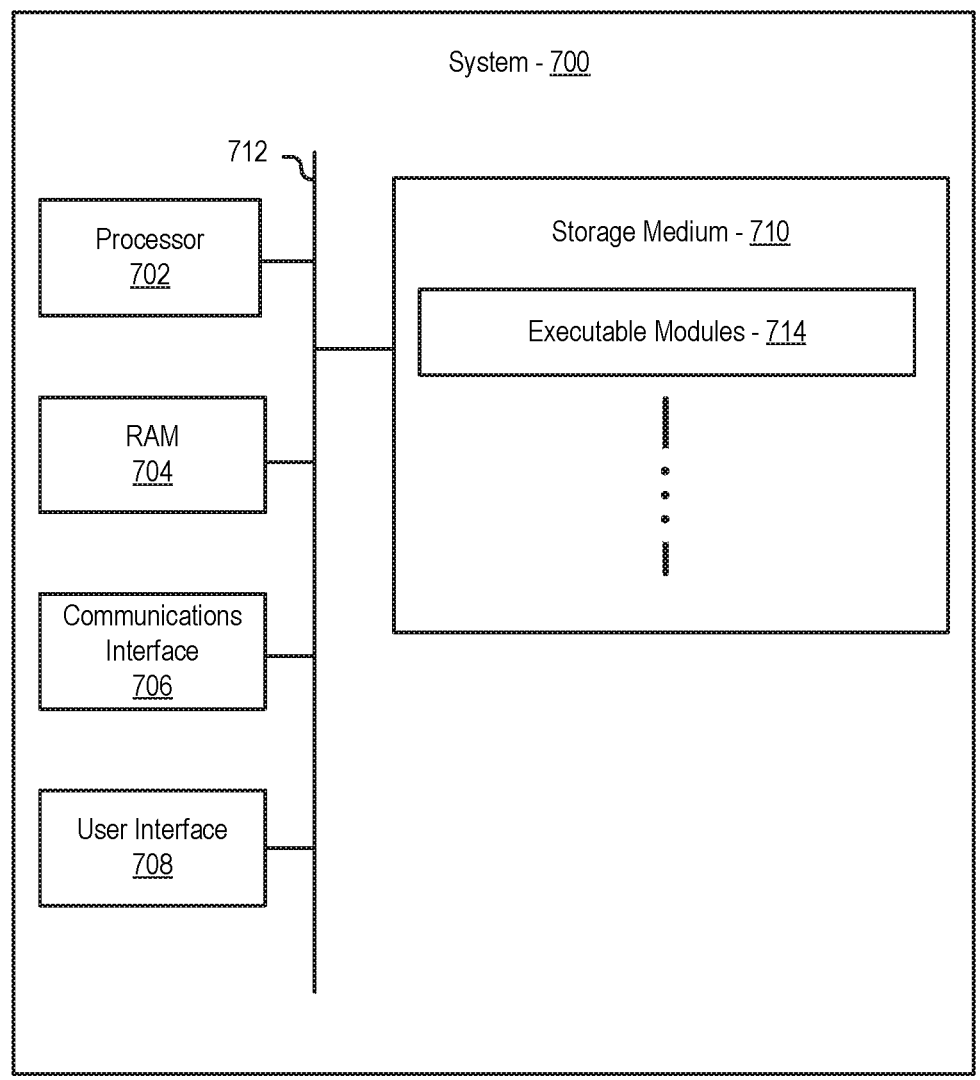
FIG. 7 illustrates an exemplary system for implementing certain embodiments of the systems and methods disclosed herein.

FIG. 7 illustrates an exemplary system 700 for implementing certain embodiments of the systems and methods disclosed herein. In certain embodiments, the computer system 700 may be a personal computer system, a server computer system, an on-board vehicle computer, a battery control system, an external computer system, and/or any other type of system suitable for implementing the disclosed systems and methods. In further embodiments, the computer system 700 may be any portable electronic computer system or electronic device including, for example, a notebook computer, a smartphone, and/or a tablet computer.

As illustrated, the computer system 700 may include, among other things, one or more processors 702, random access memory ("RAM") 704, a communications interface 706, a user interface 708, and a non-transitory computer-readable storage medium 710. The processor 702, RAM 704, communications interface 706, user interface 708, and computer-readable storage medium 710 may be communicatively coupled to each other via a common data bus 712. In some embodiments, the various components of the computer system 700 may be implemented using hardware, software, firmware, and/or any combination thereof.

User interface 708 may include any number of devices allowing a user to interact with the computer system 700. For example, user interface 708 may be used to display an interactive interface to a user. The user interface 708 may be a separate interface system communicatively coupled with the computer system 700 or, alternatively, may be an integrated system such as a display interface for a laptop or other similar device. In certain embodiments, the user interface 708 may be produced on a touch screen display. The user interface 708 may also include any number of other input devices including, for example, keyboard, trackball, and/or pointer devices.

The communications interface 706 may be any interface capable of communicating with other computer systems, peripheral devices, and/or other equipment communicatively coupled to computer system 700. For example, the communications interface 706 may allow the computer system 700 to communicate with other computer systems (e.g., computer systems associated with external databases and/or the Internet), allowing for the transfer as well as reception of data from such systems. The communications interface 706 may include, among other things, a modem, a satellite data transmission system, an Ethernet card, and/or any other suitable device that enables the computer system 700 to connect to databases and networks, such as LANs, MANs, WANs and the Internet.

Processor 702 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 702 may be configured to execute computer-readable instructions stored on non-transitory computer-readable storage medium 710. Computer-readable storage medium 710 may store other data or information as desired. In some embodiments, the computer-readable instructions may include computer executable functional modules 714. For example, the computer-readable instructions may include one or more functional modules configured to implement all or part of the functionality of the systems and methods described above. Specific functional models that may be stored on computer-readable storage medium 710 may include one or more modules to parametrize elements of an ECM associated with a battery system, one or more modules to estimate a state of the battery system, and/or any other module or modules configured to implement the systems and methods disclosed herein.

The system and methods described herein may be implemented independent of the programming language used to create the computer-readable instructions and/or any operating system operating on the computer system 700. For example, the computer-readable instructions may be written in any suitable programming language, examples of which include, but are not limited to, C, C++, Visual C++, Fortran and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 700 may be in response to user commands, results of previous processing, or a request made by another processing machine. It will be appreciated that computer system 700 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a state of a battery system, the method comprising:

measuring a terminal voltage of the battery system;
measuring a current and a temperature through the battery system;
determining parameters of a battery system model based, at least in part, on the measured terminal voltage of the battery system and the measured current through the battery system, the battery system model comprising at least one nonlinear element configured to model a nonlinear voltage to current response of the battery system, wherein determining the parameters of the battery system model comprises determining parameters associated with the at least one nonlinear element based, at least in part, on a piecewise polynomial approximation of the nonlinear voltage to current response of the battery system, wherein the piecewise polynomial approximation of the nonlinear voltage to current response partitions the nonlinear voltage to current response into regions based on the current and the temperature, with voltage being a polynomial function of the current and the temperature in each respective one of the regions;
determining a predicted battery system voltage based, at least in part, on the battery system model;
estimating the state of the battery system based on the predicted battery system voltage; and
implementing a control action in a vehicle associated with the battery system based on the estimated battery system state, wherein the control action comprises at least one of adjusting a maximum allowed acceleration of the vehicle, adjusting initiation of an electric drivetrain system of the vehicle, and adjusting a regenerative braking acceptance setting of the vehicle.

2. The method of claim 1, wherein the state of the battery system comprises a state of power of the battery system.

3. The method of claim 2, wherein the state of the battery system comprises a current-limited state of power of the battery system.

4. The method of claim 2, wherein the state of the battery system comprises a voltage-limited state of power of the battery system.

5. The method of claim 1, wherein the state of the battery system comprises a state of charge of the battery system.

6. The method of claim 1, wherein the battery system model comprises an equivalent circuit model and the nonlinear element comprises a nonlinear resistor.

7. The method of claim 6, wherein the nonlinear element further comprises a linear capacitor disposed in parallel with the nonlinear resistor.

8. The method of claim 1, wherein the battery system model further comprises an element modeling an open circuit voltage of the battery system and a linear element disposed in series with the nonlinear element.

9. The method of claim 8, wherein the linear element comprises a plurality of serially coupled parallel resistor capacitor pairs.

10. The method of claim 1, wherein the battery system model comprises a circuit model including elements configured to model ohmic resistance, charge transfer, and mass transfer processes of the battery system.

11. The method of claim 1, wherein determining the parameters of the battery system model further comprises determining parameters associated with the at least one nonlinear element based further, at least in part, on a Butler-Volmer model describing the kinetics of charge transfer in the battery system.

12. A non-transitory computer-readable medium storing instructions that, when executed by a processor, cause the processor to perform a method of estimating a state of a battery system comprising:
measuring a terminal voltage of the battery system;
measuring a current and a temperature through the battery system;
determining parameters of a battery system model based, at least in part, on the measured terminal voltage of the battery system and the measured current through the battery system, the battery system model comprising at least one nonlinear element configured to model a nonlinear voltage to current response of the battery system, wherein determining the parameters of the battery system model comprises determining parameters associated with the at least one nonlinear element based, at least in part, on a piecewise polynomial approximation of the nonlinear voltage to current response of the battery system, the piecewise polynomial approximation of the nonlinear voltage to current response partitions the nonlinear voltage to current response into regions based on the current and the temperature, with voltage being a polynomial function of the current and the temperature in each respective one of the regions;
determining a predicted battery system voltage based, at least in part, on the battery system model;
estimating the state of the battery system based on the predicted battery system voltage; and
implementing a control action in a vehicle associated with the battery system based on the estimated battery system state, wherein the control action comprises at least one of adjusting a maximum allowed acceleration of the vehicle, adjusting initiation of an electric drivetrain system of the vehicle, and adjusting a regenerative braking acceptance setting of the vehicle.

13. The non-transitory computer-readable medium of claim 12, wherein determining the parameters of the battery system model further comprises determining parameters associated with the at least one nonlinear element based further, at least in part, on a Butler-Volmer model describing the kinetics of charge transfer in the battery system.

* * * * *